United States Patent [19]

George

[11] 4,100,608
[45] Jul. 11, 1978

[54] EXCHANGE STACK BUFFER MEMORY

[75] Inventor: Peter K. George, San Jose, Calif.

[73] Assignee: Rockwell International Corporation, El Segundo, Calif.

[21] Appl. No.: 773,101

[22] Filed: Feb. 28, 1977

[51] Int. Cl.² ............................................. G11C 19/08
[52] U.S. Cl. ........................................ 365/2; 365/14; 365/19; 365/41
[58] Field of Search ...................... 340/174 TF, 173 R; 365/2, 14, 15, 19, 41

[56] References Cited

U.S. PATENT DOCUMENTS

| 3,701,126 | 10/1972 | Reichard | 340/174 TF |
| 3,743,788 | 7/1973 | Krupp et al. | 340/174 TF |

*Primary Examiner*—James W. Moffitt
*Attorney, Agent, or Firm*—H. Fredrick Hamann; G. Donald Weber, Jr.

[57] ABSTRACT

There is provided a memory system, for example, a magnetic bubble domain memory, which includes an exchange stack buffer memory between a main storage area and other portions of a bubble domain chip organization. The buffer memory includes a plurality of magnetic areas, such as discs, arranged in an ordered array between the main storage area and the remainder of the chip organization. Control conductors are arranged to interconnect each row of magnetic areas with an adjacent row of similar areas, or with portions of the main storage area, or with the remainder of the chip organization circuit. Means are provided to supply signals to the control conductors to selectively transfer information from a row of magnetic areas to one of the adjacent areas.

9 Claims, 2 Drawing Figures

EXCHANGE STACK BUFFER MEMORY

BACKGROUND

1. Field of the Invention

This invention relates to memory systems, in general, and to magnetic bubble domain buffer memory systems, in particular.

2. Prior Art

Magnetic bubble domains are currently recognized as the new wave of technology for establishing information handling systems. Various structures have been devised and developed to implement this technology. Some of these devices include large scale memory or storage areas. The memories can be serial or parallel arrangements. However, even the parallel (major/minor loop) storage areas tend to require significant access time in obtaining information from the particular area or loop.

In order to improve the throughput operation of such a system, a buffer memory arrangement can be provided between the large memory or storage area and a suitable operational unit, such as an an input/output loop or the like. Various types of buffer memories have been suggested and are known in the art. However, most of the known buffer memory arrangements utilize devices which require close tolerances on the device fabrication. These close tolerance requirements on device structures tend to make the buffer memories expensive and subject to yield problems, and the like. Consequently, it is highly desirable to obtain a buffer memory arrangement to permit higher throughput rates for a system. In addition, reduced tolerance requirements and increased yield as a result of decreased complexity of the buffer memory are desirable.

SUMMARY OF THE INVENTION

This invention is directed to a buffer memory for use in an information handling system. In particular, the system is directed at magnetic bubble domain memories. The buffer memory consists of a series of rows and columns of magnetizable (e.g. permalloy) discs arranged in a regular pattern on a magnetic bubble domain material to provide storage positions. Conductor lines are disposed adjacent the storage positions represented by the permalloy discs for control purposes. The conductors and discs can be fabricated as one or two level structures. By selectively applying control signals to the control conductors, information in the form of magnetic bubble domains can be transferred and/or exchanged between rows of discs as well as input, output or storage areas.

DESCRIPTION OF PREFERRED EMBODIMENT

Figure 1:
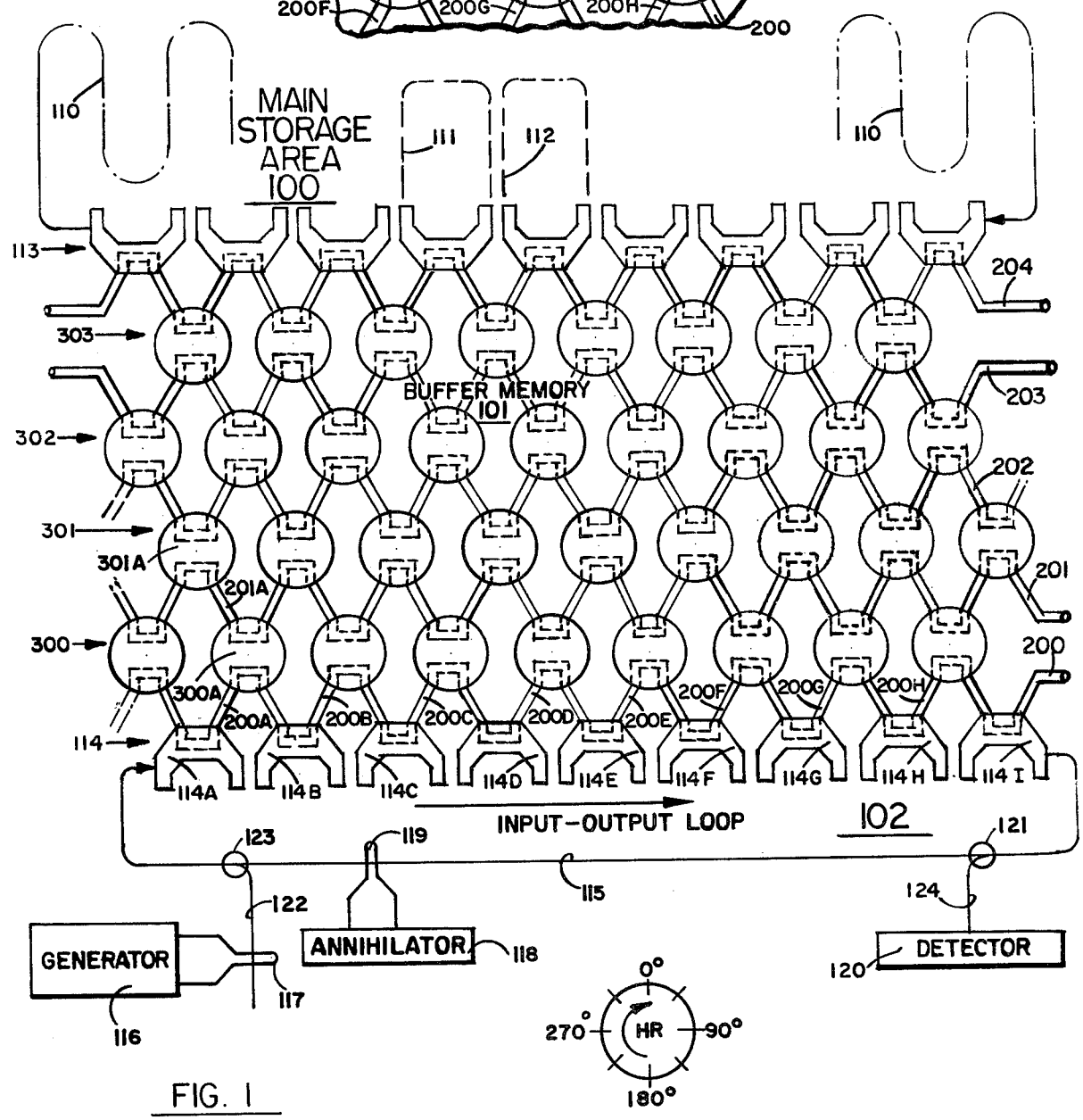
FIG. 1 shows a schematic representation of an information handling system for use with magnetic bubble domains incorporating the exchange stack buffer memory of the instant invention.

Referring now to FIG. 1 there is shown an information handling system, typically of the magnetic bubble domain type. The system includes, generally, a storage area 100, a buffer memory 101 and input/output loop 102 on a magnetic chip 103 which is represented by the plane of the drawing.

Chip 103 may be fabricated of any suitable material such as a magnetic garnet, an orthoferrite or the like. The type of material is not critical to this invention so long as magnetic bubble domains can be formed and manipulated therein.

Main storage area 100 may be considered to be a memory for the information handling system. The storage area memory can be either a serial or a parallel arrangement. In the serial arrangement, a continuous serial loop 110 is provided. This type of memory permits storage of large amounts of information in a serial manner. Consequently, access or throughput time is relatively slow because of the time consumed in searching out or accessing information in any particular location in loop 110. In the parallel arrangement, loops 111, 112 and the like are provided. These loops permit parallel interchange of information from the respective loops in the standard arrangement. Loops 111 and 112 may be considered to be the minor loop portions of a major/minor loop arrangement.

In the illustrative embodiment, both serial (loop 110) as well as parallel (loops 111 and 112) types of memory arrangements are shown. It is to be understood that, in general, either a serial or a parallel arrangement will be utilized. The serial and parallel types of operation will generally not be intermixed. However, for the purposes of illustration, both serial and parallel loops are suggested.

Regardless of the mode of storage (serial or parallel), main storage area 100 is interconnected with a suitable propagation path 113 which comprises a plurality of suitable devices. The devices shown in row 113 are gap tolerant devices shown and described in copending application entitled GAP TOLERANT BUBBLE DOMAIN PROPAGATION CIRCUITS, by Peter K. George et al, bearing Ser. No. 709,986, filed on July 30, 1976, and assigned to the common assignee.

The elements (devices) in row 113 are used to interface with buffer memory 101, which is described in detail hereinafter. At the other side or end of buffer memory 101 is a similar row 114 of interface elements. Again, in this instance, the interface elements illustrated in row 114 are gap tolerant devices as described supra. It must be understood, of course, that other interface elements may be utilizable in rows 113 and/or 114.

Row 114 is a portion of the input/output loop 102 which includes the propagation path 115. Path 115 may be any suitable type of propagation path comprising elements such as shown in row 114 or, conversely, comprising chevrons, T-bars or the like.

A suitable generator device, including conductor loop 117 connected to signal generator 116 is associated with propagation path 122 which merges with path 115 at merge 123 which is a suitable device known in the art. By appropriately applying signals from source 116 to conductor loop 117, magnetic bubble domains are produced in propagation path 122 and supplied to input/output loop 102 in a standard manner.

Likewise, an annihilator signal source 118 is connected to conductor loop 119 which is utilized to annihilate bubbles in the input/output loop. Typically, the selective application of a signal from annihilator signal source 118 is applied to conductor loop 119 to apply an appropriate magnetic field to propagation path 115 to annihilate a magnetic bubble therein.

Likewise, detector 120, which may be any suitable detector, such as a guardrail detector or the like, many of which are known in the art, is connected via a short propagation path 124 to replicator 121 which is associated with propagation path 115. A suitable detector, known in the art, is defined in copending application MAGNETIC BUBBLE DOMAIN DETECTOR DEVICE, by John L. Archer et al, bearing Ser. No. 689,435, and filed on May 24, 1976 and now U.S. Pat. No. 4,031,526. The detector 120 is adapted to receive signals (bubbles) from path 115 via replicator 121 and path 124 to produce output signals representative of the bubble domain condition.

Referring now to buffer memory 101, there is shown an array of discs which may be, typically, of permalloy or other suitable material for controlling the manipulation of magnetic bubble domains. The discs are interconnected by suitable conductor elements which form a zig-zag or serpentine type path between adjacent rows of discs or between a row of discs and the adjacent input/output elements or devices, such as rows 113 and 114. Each of the conductors is connected to a suitable signal source (not shown) which selectively applies control signals thereto. The control signals are directed through the conductors in such a fashion as to produce a magnetic field therearound which controls magnetic bubble domain propagation relative to the magnetic discs described hereinafter. The conductors may be deposited separately under the discs and the interface elements, as shown, in a standard, two-level fabrication process. In the alternative, the conductors may be formed along with and as part of the discs and the interface elements during a single level process.

In operation, generator loop 117, in response to a signal from generator source 116 in conjunction with the rotating field $H_R$ will produce a bubble domain in path 122 in the known fashion. The bubble in path 122 will, under the influence of the rotational field applied in a standard manner, propagate along path 122 through merge 123 into input/output loop 102. The bubble will ultimately be transferred to row 114 for propagation therealong as defined in the application of P. K. George et al, described supra. The bubbles will propagate along input/output loop 102 in the standard manner.

In addition, bubbles will pass through passive replicator 121 and propagate along path 124 as well as along loop 102. The bubbles which pass along propagation path 124 are ultimately detected by detector 120 in a known fashion.

The bubbles may continue to propagate around input/output loop 102 in response to the rotational field $H_R$ applied thereto. However, when data is to be changed, annihilator source 118 applies a signal to annihilator conductor loop 119 to selectively annihilate or destroy the bubbles moving along propagation path 115. This type of operation is known in the art and forms no portion of the invention, per se.

When information (e.g. 8 bits) is to be loaded into the system, bubbles are generated as described above. These bubbles are propagated through row 114 until there are eight bubbles, for example, stored in row 114. The bubbles at each of the elements in row 114 propagate around the periphery thereof in a clockwise manner. Thus, the bubbles will propagate from element 114A through 114I, as described in the aforementioned copending application of P. K. George et al, in the absence of the application of a control signal. When a control signal is applied to conductor 200, the bubbles propagating around elements 114A through 114H will be effectively blocked by the magnetic field produced around conductor segments 200A through 200H. However, the bubbles tend to stretch out along the conductor segments 200A through 200H and to be drawn toward the discs in row 300. By maintaining the control signal on conductor 200 for the appropriate length of time, the bubble on element 114A will be elongated and stretched between element 114A and bubble disc 300A. As the rotational field $H_R$ rotates, the stretched bubble is caused to bend or rotate around the periphery of disc 300A. The bubbles at the other discs are effected similarly. The eight bubbles are, thus, essentially deflected from row 114 into row 300. The control signal on conductor 200 is terminated at the appropriate point so that the bubbles which have been transferred to the discs in row 300 continue to propagate around the periphery of the discs in the known manner. At this time, additional bubbles may be loaded into row 114 from input/output loop 102.

In order to transfer bubble domains from row 300 to 301, a control signal is supplied along conductor 201. Again, this control signal is of appropriate amplitude and direction to effectively block the bubble which is propagating around the periphery of disc 300A in response to rotating field $H_R$. Again, the bubble tends to stretch out along conductor segment 201A toward disc 301. As rotating field $H_R$ continues to rotate, the bubble is ultimately attracted to disc 301A and caused to propagate around the periphery thereof in manner described supra.

Propagation of bubbles from discs in row 301 to discs in row 302 is similar to that described supra relative to row 300. Likewise, transfer of information from row 302 to row 303 and from row 303 to row 113 is similar to that described supra.

Typically, the control signals supplied to conductors 200–204 will be applied approximately from the 45°–235° positions of a rotating field $H_R$ in transfers controlled by the even numbered conductors such as conductors 200, 202 and the like. Conversely, the control signals on the odd numbered conductors will be provided between approximately the 315°–135° positions of rotating field $H_R$. Thus, it is seen that a plurality of magnetic bubbles representing a block of information can be passed, in parallel, from input/output loop 102 to storage area 100 whether the storage area is serial or parallel in nature. The transfer of information from storage area 100 to input/output loop 102 is the inverse of the transfer described supra. In addition, the control signals applied to conductors 200–204 have to be altered in terms of the time application. For example, in transferring a bubble from an element in row 113 to a disc in row 303, the control signal applied to conductor 204 would be applied from about the 135°–315° positions of rotating field $H_R$. Similar adjustments would be made to the transfer control signals supplied to conductors 200–203, respectively.

However, the major advantage of a buffer memory is to retain information as close to the input/output loop as possible to reduce access time. It is known that information which has been recently used in an information handling system, is more likely to be utilized than the information which is stored elsewhere in the memory system. Consequently, it is desirable to keep the most recently utilized information in the readily accessible areas. Consequently, it is desirable to store information in the buffer memory 101 region and to permit the exchange of information between adjacent rows in buffer memory 101 to allow fast access of this information as well as the transfer of information in a stepwise function into main storage area 100. Thus, the stack can be accessed by sequentially exchanging information in adjacent rows. Hence, if information in the third row from the bottom, i.e. row 302, is required, the information in this row is exchanged with the information in the second row, i.e. row 301. Then the information in rows 301 and 300, and rows 300 and 114 is exchanged in turn. The data is then transferred into input/output loop 102, detected and returned to the first row, i.e. row 300. This permits the data to remain in the first row whereby the most recent data is retained near the output circuit. Of course, in order to effect this transfer, it is necessary that the control signals be applied at the appropriate times.

Figure 2:
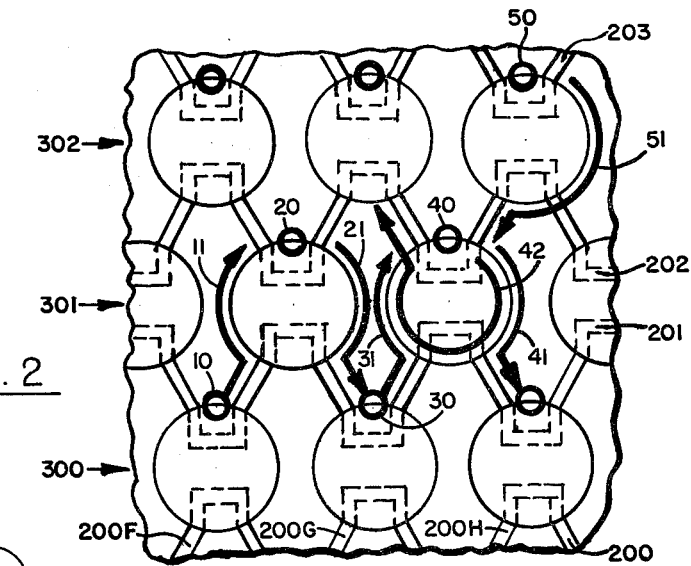
FIG. 2 is an enlarged portion of the exchange stack buffer of the instant invention showing bubble domain transfers and exchanges.

Reference is now made to FIG. 2 for a description of the operation of an exchange of bubbles between adjacent rows in buffer memory 101. Specific discussion is directed to rows 300, 301 and 302. Thus, it is considered that bubbles are exchanged between rows 300 and 301. Initially, bubble positions are defined as the 0° position of discs as a result of the application of the field $H_R$. Hence the bubbles assume the position 10, 20, 30 and 40, as shown in the drawing. It is assumed that the control signal is applied to conductor 201 at approximately the 45° position of the rotating field $H_R$. This control signal is applied appropriately such that the magnetic field produced by conductor 201 causes the bubble at location 10 to be blocked by the magnetic field. This bubble follows path 11 and stretches along conductor 201 toward the disc in row 301. Similarly, the bubble at location 30 follows path 31. Conversely, the bubbles at positions 20 and 40 are free to rotate around the periphery of the discs in row 301 inasmuch as no signal current is supplied to conductor 202. The bubbles at the discs in row 301 follow paths 21 and 41 until effectively blocked by the current which is maintained in conductor 201. The bubbles following paths 21 and 41 stretch out toward the appropriate disc in row 300. It is clear that in an exchange operation, the magnetic bubble domains are also displaced horizontally by one disc in the lower row. It is, therefore, essential that an additional disc be placed in each row to receive and, at least on an interim basis, store the magnetic bubble domain.

The exchange of information between rows 301 and 302 follows essentially the same procedure as that employed in exchanging rows 300 and 301 except that the point at which exchange takes place is increased by 180° in rotation of field $H_R$. During the latter exchange, the row moves one bit to the left thereby restoring the horizontal position of what was originally row 300. That is, after the bubble has been transferred from row 300 to row 301 it rotates around the appropriate disc under the influence of field $H_R$. When it is desired to transfer (exchange) the bubble from row 301 to row 302 the control signal is applied to conductor 202. This control signal is delayed relative to the signal applied to conductor 201 as noted supra. In this case, the bubble follows path 42. That is, the bubble is assumed to be at location 40 as described supra. The bubble rotates around the appropriate disc 301 and follows path 42 past conductor 201 which is not energized in this transfer. However, in this transfer conductor 202 is energized, therefore, the bubble is blocked by and extends along conductor 202 toward the disc in row 302. The leftward transition is accomplished. At the same time, bubble 50 follows path 51 and is transferred to the left and into row 301 along conductor 202. These transfers and exchanges retain the proper "bookkeeping" for the bubbles.

Thus, there has been shown and described a preferred embodiment of the instant invention. It is clear that those skilled in the art will conceive applications and alternative arrangements relative to the invention taught herein. However, any such modifications or alternatives which fall within the purview of this description are intended to be included herein as well. For example, it is contemplated that any number of rows and columns of discs can be utilized. Moreover, the conductor arrangement and the polarity of the signals supplied thereto can be altered to provide different operational functions and the like. The description above is intended to be illustrative only and is not intended to be limitative of the invention. The scope of the invention is defined by the claims appended hereto:

Having thus described a preferred embodiment of the invention, what is claimed is:

1. A magnetic bubble domain memory system comprising
   means for establishing and supporting magnetic bubble domains,
   main storage means for storing said magnetic bubble domains,
   input-output means for supplying and receiving said magnetic bubble domains to and from said main storage means, and
   buffer memory means interposed between said main storage means and said input-output means for temporary storage of said magnetic bubble domains,
   said buffer means including an array of discrete storage areas disposed in rows and columns, and
   conductor means associated with each row of storage areas in said buffer memory means to selectively control movement of magnetic bubble domains relative to each row of storage areas.

2. The memory system recited in claim 1 wherein said storage areas comprise discs of magnetizable material.

3. The memory system recited in claim 2 wherein
   said input-output means includes a row of magnetizable elements for propagating magnetic bubble domains therealong,
   said row of magnetizable elements arrayed substantially in parallel to a row or, storage areas in said buffer memory means.

4. The memory system recited in claim 2 wherein
   said main storage means includes a row of magnetizable elements for propagating magnetic bubble domains therealong,
   said row of magnetizable elements arrayed substantially in parallel to a row of storage areas in said buffer memory means.

5. The memory system recited in claim 4 wherein
   said main storage means includes a plurality of independent closed loops for storing information therein,
   each of said loops coupled to said row of magnetizable elements.

6. The memory system recited in claim 4 wherein
   said main storage means comprises an elongated propagation path connected to said row of magnetizable elements.

7. The memory system recited in claim 1 wherein said buffer memory means array includes a plurality of rows and a plurality of columns of storage areas, at least one of said rows including at least one more storage area than the adjacent rows.

8. The memory system recited in claim 1 including
generator means,
annihilator means, and
detector means,
said input-output means coupled to each of said generator means, said annihilator means and said detector means.

9. The memory system cited in claim 1 wherein said conductor means comprises N+1 independent conductors where N is the number of rows of storage areas in said buffer memory means.

* * * * *